(12) United States Patent
Ueta

(10) Patent No.: US 9,635,763 B2
(45) Date of Patent: Apr. 25, 2017

(54) COMPONENT BUILT-IN BOARD MOUNTING BODY AND METHOD OF MANUFACTURING THE SAME, AND COMPONENT BUILT-IN BOARD

(71) Applicant: FUJIKURA LTD., Tokyo (JP)

(72) Inventor: Nobuki Ueta, Sakura (JP)

(73) Assignee: FUJIKURA LTD., Tokyo (JP)

( * ) Notice: Subject to any disclaimer, the term of this patent is extended or adjusted under 35 U.S.C. 154(b) by 206 days.

(21) Appl. No.: 14/229,425

(22) Filed: Mar. 28, 2014

(65) Prior Publication Data

US 2014/0211437 A1 Jul. 31, 2014

Related U.S. Application Data

(63) Continuation of application No. PCT/JP2012/074562, filed on Sep. 25, 2012.

(30) Foreign Application Priority Data

Sep. 30, 2011 (JP) ................................ 2011-216527

(51) Int. Cl.
*H05K 1/18* (2006.01)
*H01L 23/31* (2006.01)
(Continued)

(52) U.S. Cl.
CPC ......... *H05K 1/185* (2013.01); *H01L 23/3121* (2013.01); *H01L 23/3677* (2013.01);
(Continued)

(58) Field of Classification Search
CPC ....... H01L 2924/00; H01L 2224/16225; H01L 2224/32225; H01L 2224/73204;
(Continued)

(56) References Cited

U.S. PATENT DOCUMENTS 6,975,516 B2* 12/2005 Asahi .................. H01L 21/6835
174/258
8,592,689 B2* 11/2013 Shimada .............. H05K 1/0228
174/260
(Continued)

FOREIGN PATENT DOCUMENTS

JP 2002-198660 A 7/2002
JP 2002-299775 A 10/2002
(Continued)

OTHER PUBLICATIONS

Extended European Search Report dated Jun. 18, 2015, issued in corresponding European Patent Application No. 12835560.9 (6 pages).
(Continued)

*Primary Examiner* — Yuriy Semenenko
(74) *Attorney, Agent, or Firm* — Westerman, Hattori, Daniels & Adrian, LLP

(57) ABSTRACT

A component built-in board mounting body has a component built-in board mounted on a mounting board, the component built-in board being configured having stacked therein a plurality of printed wiring bases that each have a wiring pattern and a via formed on/in a resin base thereof, and having an electronic component built in thereto, wherein the component built-in board has at least a portion of the plurality of printed wiring bases including thermal wiring in the wiring pattern and including a thermal via in the via, and is mounted on the mounting board via a bump formed on a surface layer of the component built-in board, and a surface on an opposite side to an electrode formation surface of the built in electronic component is connected to the bump via the thermal via and the thermal wiring, and is thermally connected to the mounting board via the bump.

7 Claims, 5 Drawing Sheets

(51) Int. Cl.
*H01L 23/367* (2006.01)
*H01L 23/538* (2006.01)
*H05K 1/02* (2006.01)
*H05K 3/30* (2006.01)
*H01L 23/498* (2006.01)
*H05K 3/46* (2006.01)
*H05K 3/00* (2006.01)
*H05K 3/40* (2006.01)
*H05K 3/42* (2006.01)

(52) U.S. Cl.
CPC .... *H01L 23/49833* (2013.01); *H01L 23/5389* (2013.01); *H05K 1/0206* (2013.01); *H05K 1/0298* (2013.01); *H05K 1/186* (2013.01); *H05K 3/301* (2013.01); *H01L 23/49816* (2013.01); *H01L 2224/16225* (2013.01); *H01L 2224/32225* (2013.01); *H01L 2224/73204* (2013.01); *H01L 2924/01327* (2013.01); *H05K 3/0026* (2013.01); *H05K 3/4038* (2013.01); *H05K 3/4053* (2013.01); *H05K 3/429* (2013.01); *H05K 3/462* (2013.01); *H05K 3/4614* (2013.01); *H05K 3/4617* (2013.01); *H05K 3/4623* (2013.01); *H05K 2203/1453* (2013.01); *Y10T 29/4913* (2015.01)

(58) Field of Classification Search
CPC ....... H01L 2924/01327; H01L 23/3121; H01L 23/3677; H01L 23/49816; H01L 23/49833; H01L 23/5389; H05K 1/0206; H05K 1/0298; H05K 1/18
USPC .......... 361/760, 761–764; 174/256, 258–260
See application file for complete search history.

(56) References Cited

U.S. PATENT DOCUMENTS

| | | | |
|---|---|---|---|
| 2002/0175402 A1* | 11/2002 | McCormack | H01L 23/5389 257/700 |
| 2003/0128522 A1* | 7/2003 | Takeda | H01L 23/345 361/715 |
| 2006/0003495 A1* | 1/2006 | Sunohara | H01L 21/4857 438/124 |
| 2007/0095471 A1 | 5/2007 | Ito et al. | |
| 2008/0212283 A1* | 9/2008 | Chernyakov | H01L 23/3677 361/709 |
| 2009/0168367 A1* | 7/2009 | Fujii | H01L 23/3128 361/720 |
| 2010/0025082 A1* | 2/2010 | Sasaoka | H05K 1/0206 174/252 |
| 2010/0295170 A1 | 11/2010 | Komura et al. | |

FOREIGN PATENT DOCUMENTS

| | | |
|---|---|---|
| JP | 2006-108483 A | 4/2006 |
| JP | 2006-310541 A | 11/2006 |
| JP | 2008-98285 A | 4/2008 |
| JP | 2008-205124 A | 9/2008 |
| JP | 2010-021368 A | 1/2010 |
| JP | 2010-118589 A | 5/2010 |
| JP | 2010-123632 A | 6/2010 |
| JP | 2011-009715 A | 1/2011 |
| WO | 2007/043714 A1 | 4/2007 |

OTHER PUBLICATIONS

International Search Report dated Nov. 27, 2012, issued in corresponding application No. PCT/JP2012/074562.

* cited by examiner

COMPONENT BUILT-IN BOARD MOUNTING BODY AND METHOD OF MANUFACTURING THE SAME, AND COMPONENT BUILT-IN BOARD

CROSS-REFERENCE TO RELATED APPLICATIONS

This application is a continuation application of PCT Application No. PCT/JP2012/074562, filed on Sep. 25, 2012, which is based on and claims the benefit of priority from prior Japanese Patent Application No. 2011-216527, filed on Sep. 30, 2011, the entire contents of which are incorporated herein by reference.

BACKGROUND OF THE INVENTION

Field of the Invention

This invention relates to a component built-in board mounting body in which a component built-in board having an electronic component built in thereto is mounted on a mounting board, and a method of manufacturing the same, and to a component built-in board.

Description of the Prior Art

In recent years, miniaturization or higher levels of integration are being required in electronic components of semiconductors and the like, and there is a tendency to increasingly adopt three-dimensional packaging technology such as CoC (Chip on Chip) and PoP (Package on Package), and component built-in boards having an electronic component built in thereto. In these packaging technologies, and so on, it becomes important that structural design takes sufficient account of heat radiation characteristics of the built in electronic component.

In a generally-employed electronic component configured from a silicon semiconductor, there is a possibility that when, for example, Tj temperature (semiconductor element temperature) attains 175° C. or more, the semiconductor element itself is destroyed, hence thermal design is performed such that Tj temperature is in a range of 80° C. to 100° C. Specifically, in a component built-in board, structural design taking account of heat radiation characteristics is important since a periphery of the built in electronic component (IC chip or passive component) is covered by an insulating resin material (for example, an epoxy resin or polyimide resin whose heat transmission coefficient is approximately 0.2 W/mk). The insulating resin material has a heat transmission coefficient which is about one thousandth (1/1000) compared to that of a wiring metal material (for example, copper whose heat transmission coefficient is approximately 370 W/mk).

A known electronic component built-in type wiring board that takes account of heat radiation characteristics in this way is the electronic component built-in type wiring board disclosed in Japanese Unexamined Patent Application Publication No. 2008-205124 A. This electronic component built-in type wiring board has a structure in which by forming a thermal via on a surface on an opposite side to an electrode formation surface of the built in electronic component, heat of the electronic component is radiated from this thermal via to external air via a heat radiation board in a surface layer.

SUMMARY OF THE INVENTION

However, the electronic component built-in type wiring board disclosed in above-mentioned Japanese Unexamined Patent Application Publication No. 2008-205124 A has a structure in which heat is radiated via the thermal via and the heat radiation board only to external air. Hence, it cannot say that heat radiation characteristics of the electronic component have been sufficiently improved, and there is room for further improvement in heat radiation characteristics to be achieved. In addition, overall thickness of the board ends up increasing by an amount of thickness of the heat radiation board. Hence, for example, when mounted on a mounting board, overall height increases and it cannot say that the structure is sufficiently responding to the requirements of miniaturization, and so on. Furthermore, the heat radiation board needs to be disposed in a close vicinity of the electronic component. Hence, there is a problem that flexibility of layout of the electronic component is limited.

An object of the invention is to overcome the above-mentioned problems due to the conventional technology, to provide a component built-in board mounting body, which is capable of miniaturization, has high flexibility of layout of the built in electronic component, and makes it possible to achieve an improvement in heat radiation characteristics of the electronic component built in to the component built-in board, a method of manufacturing the component built-in board mounting body and a component built-in board.

A component built-in board mounting body according to the present invention has a component built-in board mounted on a mounting surface of a mounting board, the component built-in board being configured having stacked therein a plurality of printed wiring bases that each have a wiring pattern and a via formed on/in a resin base thereof, and the component built-in board being configured having an electronic component built in thereto, wherein the component built-in board has at least a portion of the plurality of printed wiring bases including thermal wiring in the wiring pattern and including a thermal via in the via, and the component built-in board is mounted on the mounting board via a bump formed on a surface layer of the component built-in board, and a surface on an opposite side to an electrode formation surface of the built in electronic component is connected to the bump via the thermal via and the thermal wiring, and is thermally connected to the mounting board via the bump.

As a result of the component built-in board mounting body according to the present invention, the surface on the opposite side to the electrode formation surface of the electronic component built in to the component built-in board is connected to the mounting board via the thermal via, the thermal wiring, and the bump formed on the surface layer of the component built-in board. Therefore, heat of the electronic component is transmitted along the thermal via, the thermal wiring, and the bump that act as a heat radiation path, to be radiated efficiently and reliably to the mounting board. The mounting board has a sufficiently large surface area compared to the electronic component or the component built-in board, hence is better than a heat radiation board as a heat radiation medium, and there is no need to provide a conventional kind of heat radiation board. As a result, miniaturization is possible, and it is possible to achieve improvement in heat radiation characteristics of the built in electronic component while increasing flexibility of layout of the electronic component.

In an embodiment of the present invention, the electronic component is disposed between the thermal wiring and the mounting board in a stacking direction of the printed wiring bases.

Moreover, in another embodiment of the present invention, the thermal wiring is disposed between the electronic component and the mounting board in the stacking direction of the printed wiring bases.

A method of manufacturing a component built-in board mounting body according to the present invention, the component built-in board mounting body having a component built-in board mounted on a mounting surface of a mounting board, the component built-in board being configured having stacked therein a plurality of printed wiring bases that each have a wiring pattern and a via formed on/in a resin base thereof, and the component built-in board being configured having an electronic component built in thereto, comprises the steps of: forming the wiring pattern including thermal wiring and the via including a thermal via in a plurality of the resin bases, and forming in at least one of the plurality of resin bases an opening where the electronic component is built in, thereby forming the plurality of printed wiring bases; collectively stacking the plurality of printed wiring bases by thermal compression bonding such that a surface on an opposite side to an electrode formation surface of the electronic component is connected to the thermal wiring via the thermal via, thereby forming the component built-in board; forming on a surface layer of the component built-in board a bump connected to the thermal wiring; and mounting the component built-in board on the mounting surface of the mounting board via the bump.

As a result of the method of manufacturing a component built-in board mounting body according to the present invention, the surface on the opposite side to the electrode formation surface of the electronic component built in to the component built-in board is connected to the thermal wiring via the thermal via, and the bump connected to the thermal wiring is formed on the surface layer of the component built-in board to perform mounting on the mounting board, hence working effects similar to those described above can be displayed.

A component built-in board according to the present invention is configured having stacked therein a plurality of printed wiring bases each having a wiring pattern and a via formed on/in a resin base thereof, and is configured having an electronic component built in thereto, wherein at least a portion of the plurality of printed wiring bases include thermal wiring in the wiring pattern and include a thermal via in the via, and the component built-in board is mounted on a mounting board via a bump formed on a surface layer of the component built-in board, and a surface on an opposite side to an electrode formation surface of the built in electronic component is connected to the bump via the thermal via and the thermal wiring.

As a result of the component built-in board according to the present invention, the surface on the opposite side to the electrode formation surface of the built in electronic component is connected to the bump of the surface layer via the thermal via and the thermal wiring and is therefore thermally connected to the mounting board via this bump, thereby making it possible to achieve improvement in heat radiation characteristics of the built in electronic component.

In addition, a component built-in board mounting body according to the present invention has a component built-in board mounted on a mounting surface of a mounting board, the component built-in board being configured having stacked therein a plurality of printed wiring bases that each have a wiring pattern and a via formed on/in a resin base thereof, and the component built-in board being configured having a first electronic component built in thereto and a second electronic component surface-mounted thereon, wherein the component built-in board has at least a portion of the plurality of printed wiring bases including thermal wiring in the wiring pattern and including a thermal via in the via, the component built-in board is mounted on the mounting board via a first bump formed on one of surface layers of the component built-in board and has the second electronic component surface-mounted thereon via a second bump formed on the other of the surface layers of the component built-in board, an electrode of the first electronic component is connected to the second bump via the via and the wiring pattern, and a surface on an opposite side to a formation surface of the electrode is connected to the first bump via the thermal via and the thermal wiring, and the first electronic component and the second electronic component are thermally connected to the mounting board via the via, the wiring pattern, the thermal wiring, the thermal via, the first bump, and the second bump.

As a result of the component built-in board mounting body according to the present invention, the surface on the opposite side to the formation surface of the electrode of the first electronic component built in to the component built-in board is connected to the mounting board via the thermal via, the thermal wiring, and the first bump formed on one of the surface layers of the component built-in board, and the electrode of the first electronic component is connected to the surface-mounted second electronic component via the via, the wiring pattern, and the second bump formed on the other of the surface layers of the component built-in board. Therefore, heat of the built in first electronic component is transmitted along the thermal via, the thermal wiring, and the first bump that act as a heat radiation path, to be radiated efficiently and reliably to the mounting board. Moreover, heat of the surface-mounted second electronic component is transmitted mainly along the second bump, the wiring pattern, the via, the first electronic component, the thermal via, the thermal wiring, and the first bump that act as a heat radiation path, to be similarly radiated efficiently and reliably to the mounting board. As a result, there is no need to form the heat radiation path of the second electronic component so as to be diverted to a periphery of the first electronic component, and it is thereby possible to achieve shortening of the heat radiation path and improve flexibility of wiring design. Note that the mounting board has a sufficiently large surface area compared to each of the electronic components or the component built-in board, hence is better than a heat radiation board as a heat radiation medium, and there is no need to provide a conventional kind of heat radiation board. Therefore, miniaturization is possible, and it is possible to achieve improvement in heat radiation characteristics of the built in first electronic component and the surface-mounted second electronic component while increasing flexibility of layout of the electronic components.

In addition, a method of manufacturing a component built-in board mounting body according to the present invention, the component built-in board mounting body having a component built-in board mounted on a mounting surface of a mounting board, the component built-in board being configured having stacked therein a plurality of printed wiring bases that each have a wiring pattern and a via formed on/in a resin base thereof, and the component built-in board being configured having a first electronic component built in thereto and a second electronic component surface-mounted thereon, comprises the steps of: forming the wiring pattern including thermal wiring and the via including a thermal via in a plurality of the resin bases, and forming in at least one of the plurality of resin bases an opening where the first electronic component is built in, thereby forming the plurality of printed wiring bases; collectively stacking the plurality of printed wiring bases by thermal compression bonding such that an electrode of the first electronic component built in to the opening is connected to the wiring pattern via the via, and a surface on an opposite side to a formation surface of the electrode is connected to the thermal wiring via the thermal via, thereby forming the component built-in board; forming on one of surface layers of the component built-in board a first bump connected to the thermal wiring on a side of the surface on the opposite side to the formation surface of the electrode, and forming on the other of the surface layers of the component built-in board a second bump connected to the wiring pattern on a side of the electrode; and mounting the second electronic component on the component built-in board via the second bump, and mounting the component built-in board on the mounting surface of the mounting board via the first bump.

As a result of the method of manufacturing a component built-in board mounting body according to the present invention, the surface on the opposite side to the formation surface of the electrode of the first electronic component built in to the component built-in board is connected to the thermal wiring and the first bump via the thermal via, the electrode of the first electronic component is connected to the wiring pattern and the second bump via the via, and the second electronic component surface-mounted on the component built-in board is connected to the second bump, after which the component built-in board is mounted on the mounting board via the first bump, hence working effects similar to those described above can be displayed.

Moreover, a component built-in board according to the present invention is configured having stacked therein a plurality of printed wiring bases each having a wiring pattern and a via formed on/in a resin base thereof, and is configured having a first electronic component built in thereto and a second electronic component surface-mounted thereon, wherein at least a portion of the plurality of printed wiring bases include thermal wiring in the wiring pattern and include a thermal via in the via, the component built-in board is mounted on a mounting board via a first bump formed on one of surface layers of the component built-in board and has the second electronic component surface-mounted thereon via a second bump formed on the other of the surface layers of the component built-in board, and an electrode of the first electronic component is connected to the second bump via the via and the wiring pattern, and a surface on an opposite side to a formation surface of the electrode is connected to the first bump via the thermal via and the thermal wiring.

As a result of the component built-in board according to the present invention, the surface on the opposite side to the formation surface of the electrode of the built in first electronic component is connected to the first bump of one of the surface layers via the thermal via and the thermal wiring, and the electrode of the first electronic component is connected, via the via and the wiring pattern, to the second bump on which the second electronic component is surface-mounted of the other of the surface layers, and is thermally connected to the mounting board via the first bump, thereby making it possible to achieve improvement in heat radiation characteristics of the built in first electronic component and the surface-mounted second electronic component.

Furthermore, a component built-in board mounting body according to the present invention has a component built-in board mounted on a mounting surface of a mounting board, the component built-in board being configured having stacked therein a plurality of printed wiring bases that each have a wiring pattern and a via formed on/in a resin base thereof, and the component built-in board being configured having an electronic component built in thereto, wherein the component built-in board has at least a portion of the plurality of printed wiring bases including thermal wiring in the wiring pattern and including a thermal via in the via, and the thermal wiring and the thermal via, excluding a portion thereof, are disposed on an outer peripheral side of the electronic component, and the component built-in board is mounted on the mounting board via a bump formed on a surface layer of the component built-in board, and a surface on an opposite side to an electrode formation surface of the built in electronic component is connected to the bump via the thermal via, the thermal wiring, and the thermal wiring and the thermal via disposed on the outer peripheral side of the electronic component, and is thermally connected to the mounting board via the bump.

As a result of the component built-in board mounting body according to the present invention, the surface on the opposite side to the electrode formation surface of the electronic component built in to the component built-in board is connected to the bump via the thermal via, the thermal wiring, and the thermal wiring and the thermal via disposed on the outer peripheral side of the electronic component, and is thermally connected to the mounting board via this bump. Therefore, heat of the electronic component is transmitted along the thermal via, the thermal wiring, the thermal wiring and the thermal via disposed on the outer peripheral side of the electronic component, and the bump that act as a heat radiation path, to be radiated efficiently and reliably to the mounting board. The mounting board has a sufficiently large surface area compared to the electronic component or the component built-in board, hence is better than a heat radiation board as a heat radiation medium, and there is no need to provide a conventional kind of heat radiation board. As a result, miniaturization is possible, and it is possible to achieve improvement in heat radiation characteristics of the built in electronic component while increasing flexibility of layout of the electronic component.

In an embodiment of the present invention, the electronic component is disposed between the thermal wiring and the mounting board in a stacking direction of the printed wiring bases.

Furthermore, a method of manufacturing a component built-in board mounting body according to the present invention, the component built-in board mounting body having a component built-in board mounted on a mounting surface of a mounting board, the component built-in board being configured having stacked therein a plurality of printed wiring bases that each have a wiring pattern and a via formed on/in a resin base thereof, and the component built-in board being configured having an electronic component built in thereto, comprises the steps of: forming the wiring pattern including thermal wiring and the via including a thermal via in a plurality of the resin bases such that the thermal wiring and the thermal via, excluding a portion thereof, are disposed on an outer peripheral side of the electronic component, and forming in at least one of the plurality of resin bases an opening where the electronic component is built in, thereby forming the plurality of printed wiring bases; collectively stacking the plurality of printed wiring bases by thermal compression bonding such that a surface on an opposite side to an electrode formation surface of the electronic component is connected to the thermal wiring via the thermal via, and is connected to a surface layer of the component built-in board via the thermal wiring and the thermal via disposed on the outer peripheral side of the electronic component, thereby forming the component built-in board; forming on the surface layer of the component built-in board a bump connected to the thermal wiring; and mounting the component built-in board on the mounting surface of the mounting board via the bump.

As a result of the method of manufacturing a component built-in board mounting body according to the present invention, the surface on the opposite side to the electrode formation surface of the electronic component built in to the component built-in board is connected to the thermal wiring via the thermal via, and is connected to the surface layer of the component built-in board via the thermal wiring and the thermal via disposed on the outer peripheral side of the electronic component, and the bump connected to the thermal wiring is formed on the surface layer of the component built-in board to perform mounting on the mounting board, hence working effects similar to those described above can be displayed.

Furthermore, a component built-in board according to the present invention is configured having stacked therein a plurality of printed wiring bases each having a wiring pattern and a via formed on/in a resin base thereof, and is configured having an electronic component built in thereto, wherein at least a portion of the plurality of printed wiring bases include thermal wiring in the wiring pattern and include a thermal via in the via, and the thermal wiring and the thermal via, excluding a portion thereof, are disposed on an outer peripheral side of the electronic component, and the component built-in board is mounted on a mounting board via a bump formed on a surface layer of the component built-in board, and a surface on an opposite side to an electrode formation surface of the built in electronic component is connected to the bump via the thermal via, the thermal wiring, and the thermal wiring and the thermal via disposed on the outer peripheral side of the electronic component.

As a result of the component built-in board according to the present invention, the surface on the opposite side to the electrode formation surface of the built in electronic component is connected to the bump of the surface layer via the thermal via, the thermal wiring, and the thermal wiring and the thermal via disposed on the outer peripheral side of the electronic component and is therefore thermally connected to the mounting board via this bump, thereby making it possible to achieve improvement in heat radiation characteristics of the built in electronic component.

As a result of the present invention, miniaturization is possible, and it is possible to achieve improvement in heat radiation characteristics of the built in electronic component while increasing flexibility of layout of the built in electronic component.

DESCRIPTION OF THE PREFERRED EMBODIMENTS

A component built-in board mounting body and method of manufacturing the same and a component built-in board according to embodiments of this invention will be described in detail below with reference to the accompanying drawings.

First Embodiment

Figure 1:
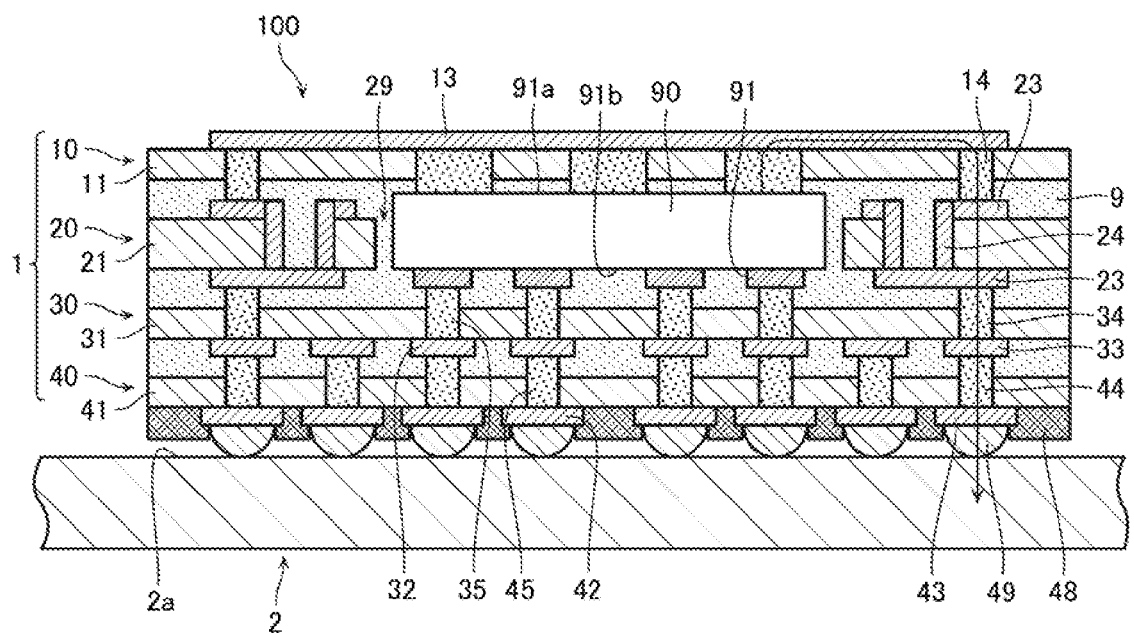
FIG. 1 is a cross-sectional view showing a structure of a component built-in board mounting body according to a first embodiment of the present invention.

FIG. 1 is a cross-sectional view showing a structure of a component built-in board mounting body according to a first embodiment of the present invention. As shown in FIG. 1, a component built-in board mounting body 100 according to the first embodiment is configured from a component built-in board 1 and a mounting board 2 on a mounting surface 2a of which the component built-in board 1 is mounted.

The component built-in board 1 comprises a structure in which a first printed wiring base 10, a second printed wiring base 20, a third printed wiring base 30, and a fourth printed wiring base 40 are stacked collectively by thermal compression bonding. Moreover, the component built-in board 1 comprises an electronic component 90 which is built in to an opening 29 formed in a second resin base 21 of the second printed wiring base 20, in a state of being sandwiched by the first and third printed wiring bases 10 and 30. Furthermore, the component built-in board 1 comprises a bump 49 formed on a mounting surface 2a side of the fourth printed wiring base 40.

The first through fourth printed wiring bases 10 to 40 respectively comprise: first through fourth resin bases 11, 21, 31, and 41; and signal-dedicated wiring lines 32 and 42, and thermal wiring lines 13, 23, 33, and 43 formed on at least one surface of these first through fourth resin bases.

In addition, the first through fourth printed wiring bases 10 to 40 respectively comprise thermal vias 14, 34, and 44 that are formed by filling inside via holes formed in the first, third, and fourth resin bases 11, 31, and 41, and a thermal via 24 that is formed inside a via hole formed in the second resin base 21 such that both surfaces of the second resin base 21 are electrically continuous, and signal-dedicated vias 35 and 45. Employable as these first through fourth printed wiring bases 10 to 40 are, for example, a single-sided copper clad laminated board (single-sided CCL) or a double-sided copper clad laminated board (double-sided CCL), and so on.

In the present example, the second printed wiring base 20 is formed based on a double-sided CCL, and the other printed wiring bases are formed based on a single-sided CCL. Therefore, the thermal wiring line 23 of the second printed wiring base 20 is formed on both surfaces of the second resin base 21, and the thermal via 24 provides interlayer connection between the thermal wiring line 23 of both these surfaces. In this case, the thermal via 24 is configured from a structure in which, for example, a plating is applied inside a through-hole formed from a side of one of the thermal wiring lines 23 without penetrating the other of the thermal wiring lines 23, and is formed by a copper plating. At this time, it is also possible to adopt a structure where the inside of the through-hole is filled with a conductive paste instead of being plated.

The first through fourth resin bases 11 to 41 are each configured by, for example, a resin film having a thickness of about 25 μm. Now, employable as the resin film are, for example, a resin film configured from the likes of a thermoplastic polyimide, polyolefin, or liquid crystal polymer, or a resin film configured from a thermosetting epoxy resin, and so on.

The electronic component 90 is the likes of a semiconductor component such as an IC chip, for example, or a passive component, and the electronic component 90 in FIG. 1 indicates a WLP (Wafer Level Package) that has been rewired. Formed on an electrode formation surface 91*b* of the electronic component 90 are a plurality of rewiring electrodes 91. The signal-dedicated wiring lines 32 and 42, and the thermal wiring lines 13 to 43 are configured by pattern-forming a conductive material such as copper foil. The signal-dedicated vias 35 and 45, and the thermal vias 14, 34, and 44 are configured from a conductive paste respectively filled into the via holes, and the thermal via 24 is formed by plating. The thermal wiring lines and thermal vias, excluding a portion thereof, are formed to be disposed on an outer peripheral side of the electronic component 90.

The conductive paste includes, for example, at least one kind of metallic particle of low electrical resistance selected from the likes of nickel, gold, silver, zinc, aluminum, iron, and tungsten, and at least one kind of metallic particle of low melting point selected from the likes of bismuth, indium, and lead. Moreover, the conductive paste is configured from a paste that has tin included as a component in these metallic particles, and has mixed into these metallic particles a binder component whose main component is an epoxy, an acrylic, a urethane, and so on.

The conductive paste configured in this way enables the included tin and the metal of low melting point contained therein to melt and form an alloy at a temperature of 200° C. or less, specifically the likes of copper or silver comprise characteristics allowing an intermetallic compound to be formed. Note that the conductive paste may also be configured by a nanopaste in which, for example, a filler of the likes of gold, silver, copper, or nickel with a nanolevel particle diameter is mixed into a binder component of the above-described kind.

In addition, the conductive paste may also be configured by a paste having metallic particles of the above-described nickel, and so on, mixed into a binder component of the above-described kind. In this case, the conductive paste is characterized in that electrical connection is performed by contact between fellow metallic particles. Employable as a method of filling the conductive paste into the via holes is, for example, a printing method, a spin coating method, a spray coating method, a dispensing method, a laminating method, a method combining use of these methods, and so on.

The bump 49 is configured from the likes of solder, and is formed at a portion above the signal-dedicated wiring line 42 and the thermal wiring line 43 formed on the mounting surface 2*a* side of the fourth resin base 41 of the fourth printed wiring base 40 not covered by a solder resist 48. The component built-in board 1 is mounted on the mounting surface 2*a* of the mounting board 2 via these bumps 49. Note that the first through fourth printed wiring bases 10 to 40 are stacked via an adhesive layer 9. The adhesive layer 9 is configured from the likes of an epoxy system or acrylic system adhesive agent, or the likes of an organic system adhesive agent including a volatile component.

The component built-in board mounting body 100 configured in this way leads to a structure in which the electronic component 90 is disposed between the thermal wiring line 13 of the first printed wiring base 10 and the mounting board 2. Heat of the electronic component 90 built in to the component built-in board 1 in this way follows the following heat radiation path to be transmitted to the mounting board 2. That is, heat of the electronic component 90 is transmitted from a back surface 91*a* on an opposite side to an electrode formation surface 91*b* of the electronic component 90 to the thermal via 14 of the first printed wiring base 10 connected to this back surface 14.

Heat transmitted to the thermal via 14 passes from the thermal wiring line 13 of the first printed wiring base 10 through the thermal via 14 formed on the outer peripheral side of the electronic component 90 to be transmitted to the thermal wiring line 23 of the second printed wiring base 20, and is then transmitted to the thermal via 34 of the third printed wiring base 30 via the thermal via 24 and the thermal wiring line 23.

Heat transmitted to the thermal via 34 passes through the thermal wiring line 33 of the third printed wiring base 30 to be transmitted to the thermal via 44 of the fourth printed wiring base 40 and be transmitted to the bump 49 via the thermal wiring line 43. Heat transmitted to the bump 49 in this way is transmitted via this bump 49 to the mounting board 2 which has an area larger than that of the component built-in board 1, to be radiated from the mounting board 2.

Due to such a structure, almost all of the heat generated by the electronic component 90 built in to the component built-in board 1 is radiated by being transmitted to the mounting board 2 from the component built-in board 1 that has a structure not requiring a heat radiation board of a conventional kind. This enables miniaturization of the component built-in board mounting body 100 to be achieved and makes it possible to increase flexibility of layout of the electronic component 90 and achieve an improvement in heat radiation characteristics of the electronic component 90 built in to the component built-in board 1.

Next, a method of manufacturing the component built-in board mounting body 100 according to the first embodiment will be described.

Figure 2:
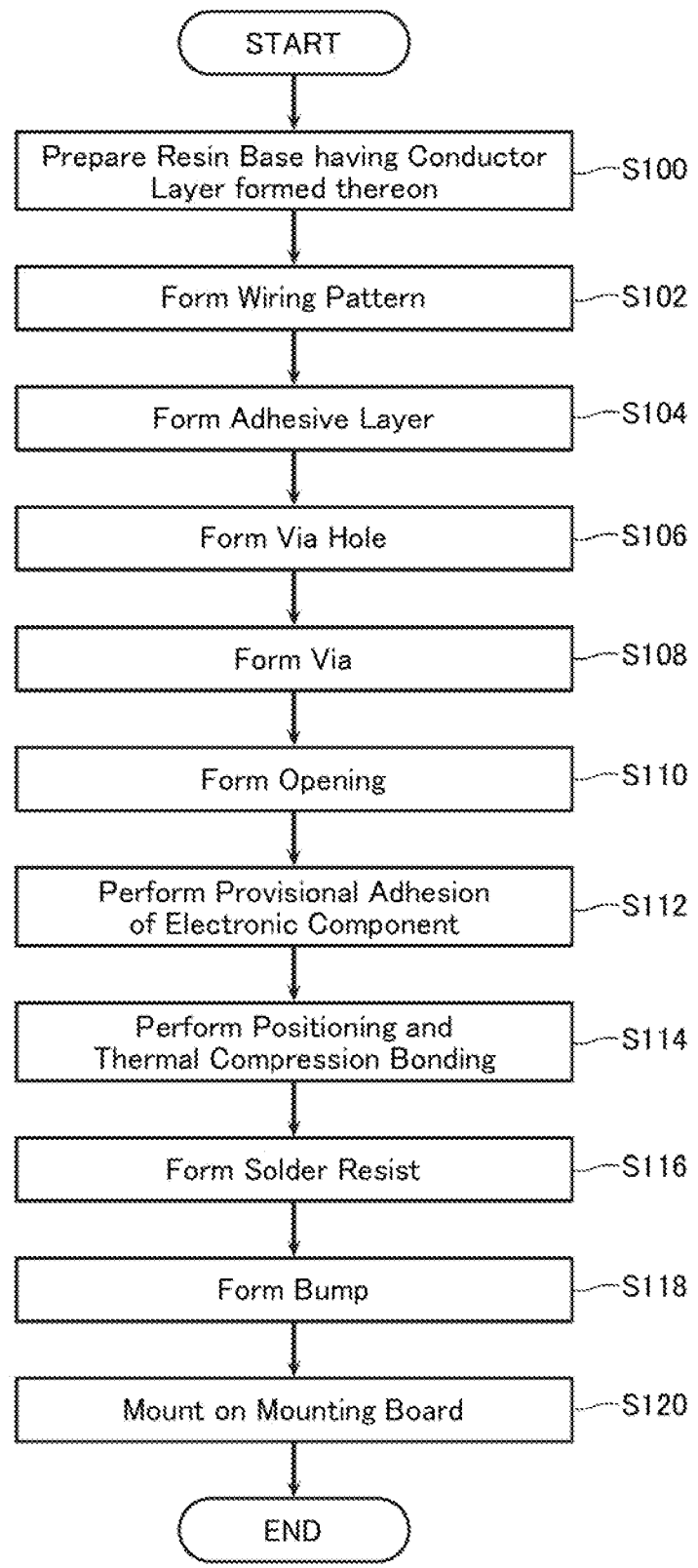
FIG. 2 is a flowchart showing a manufacturing process of same component built-in board mounting body.

FIG. 2 is a flowchart showing a manufacturing process of the component built-in board mounting body. FIG. 3A to FIG. 3D are cross-sectional views showing the component built-in board mounting body on a manufacturing process basis. First, a plurality of resin bases each of which is, for example, a single-sided copper clad laminated board (single-sided CCL), or the like, and that each have a conductor layer formed on one of surfaces thereof, are prepared (step S100), and undergo etching, or the like, to each have a wiring pattern of signal-dedicated wiring lines and thermal wiring lines, and so on, formed therein (step S102).

Next, for example, an adhesive agent is applied to the resin base to form an adhesive layer (step S104), and a via hole is formed by a laser processing machine (step S106). Then, conductive paste is filled into the via hole to form a signal-dedicated via and a thermal via (step S108). Produced in processing to this point are a plurality of basic printed wiring bases each having a wiring pattern and vias, of the likes of the first printed wiring base 10 of the kind shown in FIG. 3A, the third printed wiring base 30 of the kind shown in FIG. 3C, or the fourth printed wiring base 40, and so on.

Figure 3A:
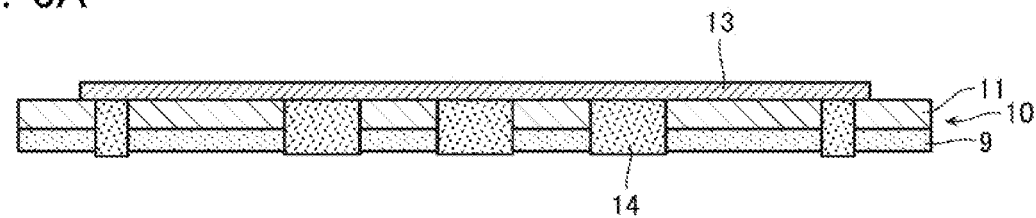
FIG. 3A is a cross-sectional view showing same component built-in board mounting body on a manufacturing process basis.
Figure 3B:
FIG. 3B is a cross-sectional view showing same component built-in board mounting body on a manufacturing process basis.
Figure 3C:
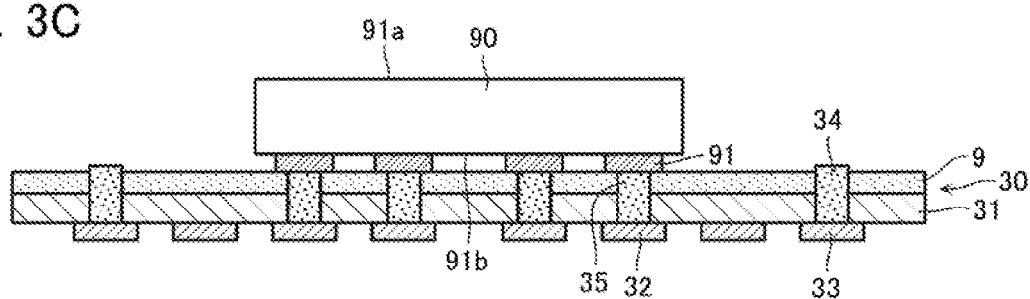
FIG. 3C is a cross-sectional view showing same component built-in board mounting body on a manufacturing process basis.

On the other hand, in the second printed wiring base 20 of the kind shown in FIG. 3B, the second resin base 21 which is, for example, a double-sided copper clad laminated board (double-sided CCL), or the like, has a through-hole formed therein, from a side of one of the thermal wiring lines 23 (in particular, a land portion connected to the thermal wiring line 23), so as to not penetrate the other of the thermal wiring lines 23 (in particular, a land portion connected to the thermal wiring line 23), the inside of the through-hole is plated to form the thermal via 24, and then the opening 29 is formed (step S110). In such a way, the first through fourth printed wiring bases 10 to 40 are prepared.

Then, a rewiring electrode 91 of the electronic component 90 is aligned with the signal-dedicated via 35 of the third printed wiring base 30 by a mounting device for an electronic component, and the electronic component 90 is provisionally adhered by applying heat at a temperature less than or equal to a curing temperature of the adhesive layer 9 of the third printed wiring base 30 and the conductive paste of the signal-dedicated via 35 (step S112).

Figure 3D:
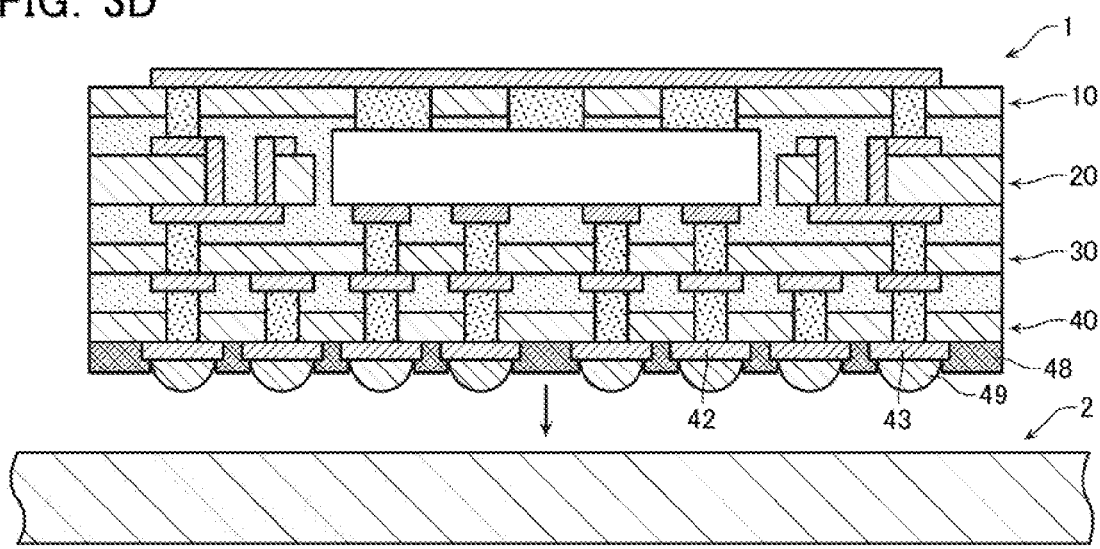
FIG. 3D is a cross-sectional view showing same component built-in board mounting body on a manufacturing process basis.

Subsequently, the first through fourth printed wiring bases 10 to 40 are each aligned and collectively stacked by, for example, performing thermal compression bonding at a heating temperature of 200° C. or less (step S114), thereby producing the component built-in board 1. Then, as shown in FIG. 3D, the fourth resin base 41 on a signal-dedicated wiring line 42 and thermal wiring line 43 side of the fourth printed wiring base 40 in the component built-in board 1 has the solder resist 48 pattern-formed thereon (step S116), each of the wiring lines 42 and 43 have the bump 49 formed thereon (step S118), and the component built-in board 1 is mounted on the mounting board 2 (step S120), thereby manufacturing the component built-in board mounting body 100 of the kind shown in FIG. 1. Note that it is also possible to configure such that solder resist 48 not illustrated is formed covering the thermal wiring line 13 above the first resin base 11 shown in FIG. 1.

Second Embodiment

Figure 4:
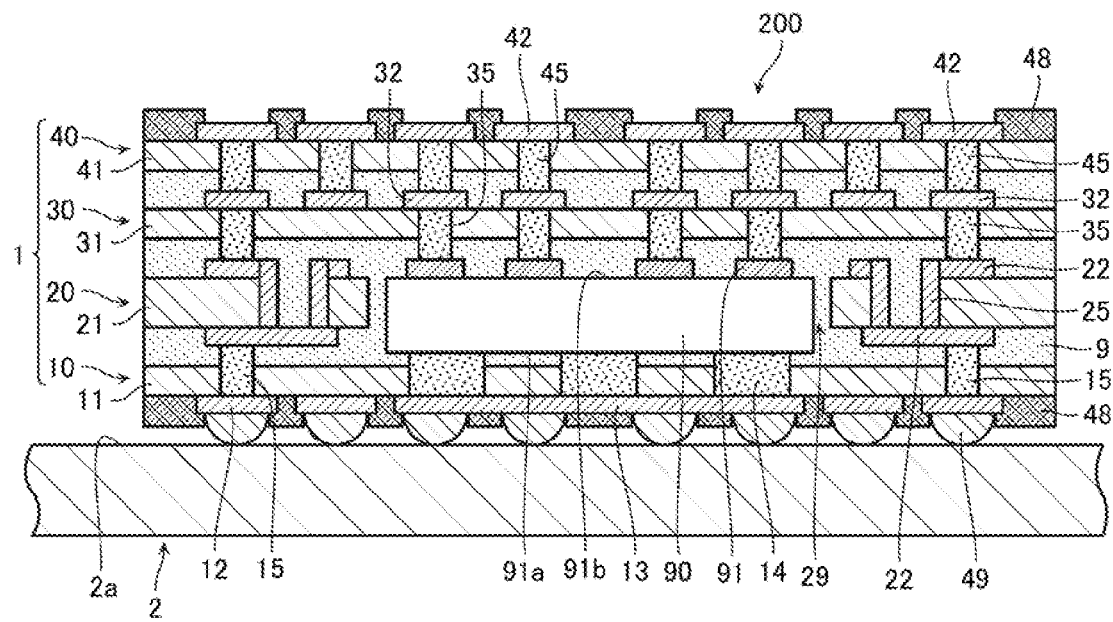
FIG. 4 is a cross-sectional view showing a structure of a component built-in board mounting body according to a second embodiment of the present invention.

FIG. 4 is a cross-sectional view showing a structure of a component built-in board mounting body according to a second embodiment of the present invention. As shown in FIG. 4, a component built-in board mounting body 200 according to the second embodiment differs from the component built-in board mounting body 100 according to the first embodiment in having the component built-in board 1 mounted face up (up and down reversed) on the mounting surface 2a of the mounting board 2, and in having a connection mode of the signal-dedicated wiring lines and thermal wiring lines of each of the printed wiring bases 10 to 40 changed due to a pattern of the thermal wiring line 13 of the first printed wiring base 10 being changed.

That is, in this component built-in board mounting body 200, solder resist 48 pattern-formed on the first resin base 11 on a thermal wiring line 13 side of the first printed wiring base 10 in the component built-in board 1 is provided, the bump 49 is formed on the signal-dedicated line 12 and the thermal wiring line 13, and the component built-in board 1 is mounted on the mounting board 2 via this bump 49. Note that additionally formed in the first and second printed wiring bases 10 and 20 are a signal-dedicated wiring line 22 and signal-dedicated vias 15 and 25.

The component built-in board mounting body 200 configured in this way has a structure in which the thermal wiring line 13 of the first printed wiring base 10 is disposed between the electronic component 90 and the mounting board 2. Therefore, heat of the electronic component 90 built in to the component built-in board 1 is transmitted from the back surface 91a to the thermal via 14 of the first printed wiring base 10, and passes through the thermal wiring line 13 and the bump 49 to be transmitted to the mounting board 2. Due to such a structure, a distance in a mounting direction between the electronic component 90 which is a heat generation source and the mounting board 2 which is a heat radiation body is made closer, hence heat radiation characteristics can be further improved over the component built-in board mounting body 100 according to the first embodiment.

Third Embodiment

Figure 5:
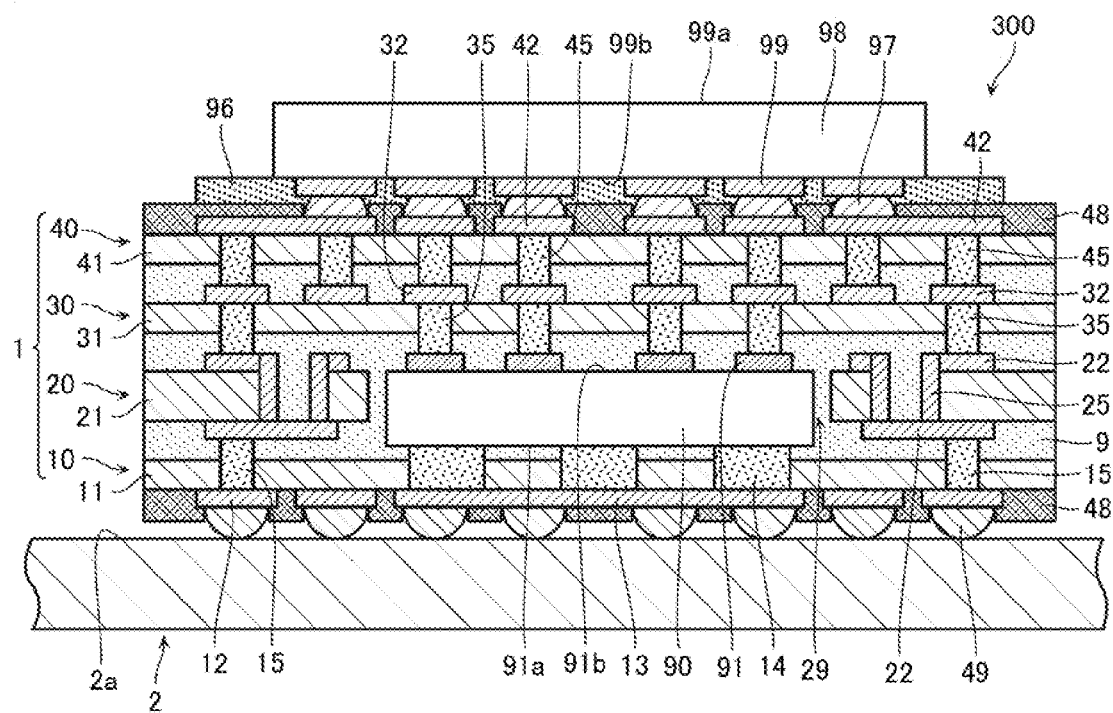
FIG. 5 is a cross-sectional view showing a structure of a component built-in board mounting body according to a third embodiment of the present invention.

FIG. 5 is a cross-sectional view showing a structure of a component built-in board mounting body according to a third embodiment of the present invention. A component built-in board mounting body 300 according to the third embodiment differs from the component built-in board mounting body 200 according to the second embodiment in having an electronic component 98 (second electronic component) further surface-mounted on the component built-in board mounting body 200 according to the second embodiment having the electronic component 90 (first electronic component) built in thereto.

That is, as shown in FIG. 5, in this component built-in board mounting body 300, a first bump 49 is formed on the signal-dedicated wiring line 12 and the thermal wiring line 13 of the first printed wiring base 10 in the component built-in board 1, and the solder resist 48 pattern-formed on the fourth resin base 41 on a signal-dedicated wiring line 42 side of the fourth printed wiring base 40 is further provided and a second bump 97 is formed on the signal-dedicated wiring line 42.

Moreover, an electrode 99 of the electronic component 98 is connected to the signal-dedicated wiring line 42 via the second bump 97, and the electronic component 98 is surface-mounted on the component built-in board 1 via an underfill 96 formed filling in between an electrode formation surface 99b of the electronic component 98 and the solder resist 48. The component built-in board 1 is mounted on the mounting surface 2a of the mounting board 2 via the first bump 49.

In the component built-in board mounting body 300 configured in this way, a signal transmission path (signal distance) between the rewiring electrode 91 of the electronic component 90 built in to the component built-in board 1 and the electrode 99 of the surface-mounted electronic component 98 can be shortened, whereby signal speed can be improved.

In addition, heat of the electronic components 90 and 98 built in to and surface-mounted on the component built-in board 1 passes through a path of all of the signal-dedicated wiring lines 12, 22, 32, and 42, and the signal-dedicated vias 15, 25, 35, and 45 linked to the first bump, including a path due to the thermal via 14 and the thermal wiring line 13 on the back surface 91a side of the electronic component 90, to be transmitted from the first bump 49 to the mounting board 2.

Due to such a structure, a signal distance and a heat radiation path from the electronic components 90 and 98 which are heat generation sources to the mounting board 2 which is a heat radiation body can each be shortened, hence heat radiation characteristics can be further improved while improving signal speed. In addition, flexibility of wiring design can be improved.

Other Embodiment

Figure 6:
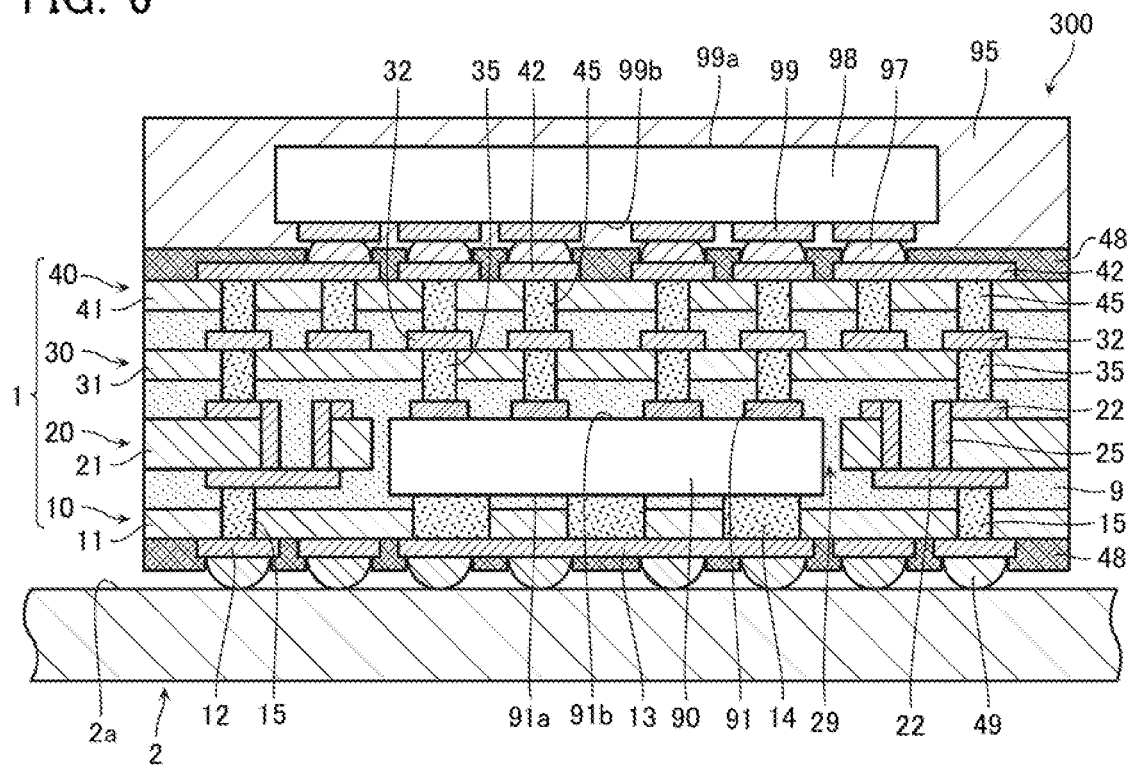
FIG. 6 is a cross-sectional view showing another structure of same component built-in board mounting body.

FIG. 6 is a cross-sectional view showing another structure of the component built-in board mounting body. As shown in FIG. 6, the component built-in board mounting body 300 may be configured such that the component built-in board 1 is mounted on the mounting board 2 in a state where an entirety of a surface mounting side of the electronic component 98 of the fourth printed wiring base 40 of the component built-in board 1 is, for example, covered by a mold resin 95, instead of the underfill 96 provided on a side of the electrode formation surface 99b of the electrode 99 of the electronic component 98.

Examples of Embodiments

The component built-in board mounting body according to the present invention will be described specifically below by examples of embodiments.

Figure 7:
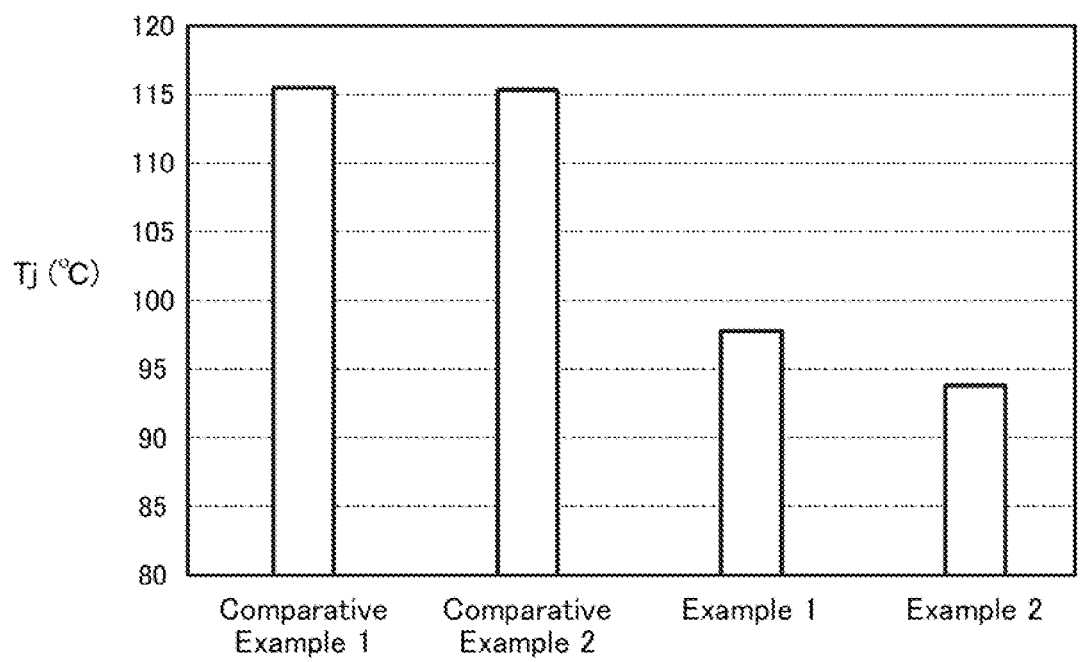
FIG. 7 is a view showing an analysis result of heat radiation characteristics of the component built-in board mounting body according to examples of embodiments of the present invention and a component built-in board mounting body of comparative examples.

FIG. 7 is a view showing an analysis result of heat radiation characteristics of the component built-in board mounting body according to examples of embodiments of the present invention and a component built-in board mounting body of comparative examples. The vertical axis of FIG. 7 indicates Tj temperature. Both the examples of embodiments and the comparative examples employed a component built-in board mounting body in which the component built-in board of four-layer structure of the above-described kind is mounted on the mounting board.

Comparative example 1 is a component built-in board mounting body having mounted on the mounting board thereof a component built-in board of a structure in which the electrode of the electronic component is disposed on a mounting board side, without the thermal via being formed on a back surface side of the electronic component. Moreover, comparative example 2 is a component built-in board mounting body having mounted on the mounting board thereof a component built-in board of a structure in which the thermal via is formed on a back surface side of the electronic component, a heat radiation board connected to this thermal via is formed on a surface layer, and the electrode of the electronic component is disposed on a mounting board side. Example 1 and example 2 are respectively configured by structures similar to those of the component built-in board mounting bodies 100 and 200.

Analysis of Tj temperature employed general-purpose software "ANSYS (Registered Trademark)", with the following boundary conditions of analysis. That is, for comparative examples 1 and 2, and examples 1 and 2, analysis was performed by applying a calorific value of 1 watt (W) to the electronic component built in to the component built-in board, assuming a static state of no convection current of external air on an external air contact surface of the component built-in board mounting body, in an environment of ambient air temperature 25° C. with a heat transmission coefficient of 4.5 W/m$^2$k.

As shown in FIG. 7, according to the analysis result, whereas Tj temperature in both comparative examples 1 and 2 attained in the neighborhood of 115° C., Tj temperature in example 1 attained in the neighborhood of 97.5° C., and in example 2 attained about 94° C. This has made it clear not only that heat radiation characteristics of the component built-in board mounting body obviously cannot be improved when there is no thermal via as in comparative example 1, but also that heat radiation characteristics of the component built-in board mounting body cannot be improved only by simply forming the thermal via or a heat radiation board on a back surface side of the electronic component as in comparative example 2.

On the other hand, it has been made clear that in a component built-in board mounting body of a type where heat of the electronic component built in to the component built-in board is radiated via the thermal via or the thermal wiring line as in examples 1 and 2, heat radiation characteristics are clearly improved compared to in the comparative examples 1 and 2. Particularly, the case of a structure where the distance in the mounting direction between the heat generation source and the heat radiation body is close as in example 2 resulted in heat radiation characteristics being further improved.

What is claimed is:

1. A component built-in board mounting body that has a component built-in board mounted on a mounting surface of a mounting board, the component built-in board being configured having stacked therein, in a stacking direction, a plurality of printed wiring bases that each have a wiring pattern and a via, the wiring pattern being formed on a resin base thereof and the via being formed in the resin base thereof, and the component built-in board being configured having an electronic component built in thereto, wherein the component built-in board has at least a portion of the plurality of printed wiring bases including thermal wiring in the wiring pattern and including a thermal via in the via, wherein the thermal wiring and the thermal via are partially disposed at a position outside an outer periphery of the electronic component in a direction orthogonal to the stacking direction, and wherein the component built-in board is mounted on the mounting board via a bump formed on a surface layer of the component built-in board, and an opposite surface on an opposite side to an electrode formation surface of the built in electronic component is connected to the bump via the thermal via, the thermal wiring, and the thermal wiring and the thermal via disposed at the position outside the outer periphery of the electronic component, and is thermally connected to the mounting board via the bump, wherein one printed wiring base of the plurality of printed wiring bases includes an opening receiving the electronic component, the thermal via disposed at the position outside the outer periphery of the electronic component penetrates the one printed wiring base in the stacking direction.

2. The component built-in board mounting body according to claim 1, wherein the electronic component is disposed between the thermal wiring and the mounting board in the stacking direction of the printed wiring bases.

3. The component built-in board mounting body according to claim 1, wherein the opposite surface directly contacts the thermal via.

4. A method of manufacturing a component built-in board mounting body, the component built-in board mounting body having a component built-in board mounted on a mounting surface of a mounting board, the component built-in board being configured having stacked therein, in a stacking direction, a plurality of printed wiring bases that each have a wiring pattern and a via, the wiring pattern being formed on a resin base thereof and the via being formed in the resin base thereof, and the component built-in board being configured having an electronic component built in thereto, the method comprising the steps of:

forming the wiring pattern including thermal wiring and the via including a thermal via in a plurality of the resin bases such that the thermal wiring and the thermal via are partially disposed at a position outside an outer periphery of the electronic component in a direction orthogonal to the stacking direction, and forming in at least one of the plurality of resin bases an opening where the electronic component is built in, thereby forming the plurality of printed wiring bases;

collectively stacking the plurality of printed wiring bases by thermal compression bonding such that an opposite surface on an opposite side to an electrode formation surface of the electronic component is connected to the thermal wiring via the thermal via, and is connected to a surface layer of the component built-in board via the thermal wiring and the thermal via disposed at the position outside the outer periphery of the electronic component, thereby forming the component built-in board;

forming on the surface layer of the component built-in board a bump connected to the thermal wiring; and mounting the component built-in board on the mounting surface of the mounting board via the bump, wherein the thermal via disposed at the position outside the outer periphery of the electronic component penetrates the one of the plurality of resin bases in the stacking direction.

5. The method of manufacturing a component built-in board mounting body according to claim 4, wherein the opposite surface directly contacts the thermal via.

6. A component built-in board that is configured having stacked therein, in a stacking direction, a plurality of printed wiring bases each having a wiring pattern and a via, the wiring pattern being formed on a resin base thereof and the via being formed in the resin base thereof, and that is configured having an electronic component built in thereto, wherein at least a portion of the plurality of printed wiring bases include thermal wiring in the wiring pattern and include a thermal via in the via, wherein the thermal wiring and the thermal via are partially disposed at a position outside an outer periphery of the electronic component in a direction orthogonal to the stacking direction, and wherein the component built-in board is mounted on a mounting board via a bump formed on a surface layer of the component built-in board, and an opposite surface on an opposite side to an electrode formation surface of the built in electronic component is connected to the bump via the thermal via, the thermal wiring, and the thermal wiring and the thermal via disposed at the position outside the outer periphery of the electronic component, wherein one printed wiring base of the plurality of printed wiring bases includes an opening receiving the electronic component, and the thermal via disposed at the position outside the outer periphery of the electronic component penetrates the one printed wiring base in the stacking direction.

7. The component built-in board according to claim 6, wherein the opposite surface directly contacts the thermal via.

* * * * *